United States Patent [19]
Lo et al.

[11] Patent Number: 5,508,605
[45] Date of Patent: Apr. 16, 1996

[54] METHOD FOR MEASURING RF PULSE FREQUENCY

[75] Inventors: Pei-Hwa Lo, Ramsey; Elliott J. Greene, Union, both of N.J.

[73] Assignee: AlliedSignal Inc., Morris Township, N.J.

[21] Appl. No.: 248,113

[22] Filed: May 24, 1994

[51] Int. Cl.[6] ........................................ G01S 5/02
[52] U.S. Cl. ........................ 324/76.42; 324/76.44; 324/76.58; 364/723; 364/577
[58] Field of Search ............... 73/861.25; 324/76.47, 324/76.55, 76.42, 76.41; 364/577, 484, 723; 342/192, 432, 442, 147

[56] References Cited

U.S. PATENT DOCUMENTS

| | | | |
|---|---|---|---|
| 3,706,095 | 12/1972 | Cherwek | 342/203 |
| 3,758,763 | 9/1973 | Nohara | 324/76.55 |
| 4,045,797 | 8/1977 | Krage | 342/194 |
| 4,121,211 | 10/1978 | Cusack | 342/200 |
| 4,324,258 | 4/1982 | Huebscher | 73/861.25 |
| 4,424,482 | 1/1984 | Drogin . | |
| 4,611,165 | 9/1986 | Nussbaum . | |
| 4,944,189 | 7/1990 | Nakajima | 73/861.25 |
| 5,262,714 | 11/1993 | Friedman | 324/76.42 |
| 5,269,308 | 12/1993 | Hagiwara | 73/861.25 |
| 5,373,236 | 12/1994 | Tsui | 324/76.42 |

*Primary Examiner*—Kenneth A. Wieder
*Assistant Examiner*—Jose M. Solis
*Attorney, Agent, or Firm*—Verne E. Kreger, Jr.

[57] ABSTRACT

A method for measuring the frequency of a stream of RF pulses using multi-purpose, commercial-off-the-shelf test devices, such as an RF signal down converter, a digitizer and a signal processor. The method is based on digital signal processing and determining the zero-crossings of the signal using signal interpolation of the pulse points. The method is suitable for real-time calculations of the frequency.

2 Claims, 3 Drawing Sheets

5,508,605

METHOD FOR MEASURING RF PULSE FREQUENCY

BACKGROUND OF THE INVENTION

1. Field of the Invention

The present invention relates to pulse RF signals, and more particularly to an inexpensive method of measuring the RF carrier frequency of a stream of pulse RF signals in real-time or near real-time.

2. Description of Related Art

Radar and electronic counter measure (ECM) systems commonly employ pulse KF signals with narrow pulse widths and low duty cycles. Such pulses typically are generated by on/off switching (e.g. using a pin switch diode) of a continuous RF source, and can be of extremely short duration (100 nanoseconds). The frequency of an RF signal emitted by these systems is an important characteristic that must be accurately measured to assess a system's performance.

The conventional method for measuring RF frequency is to use expensive equipment such as electronic counters, spectrum analyzers, synchronous detectors and digital frequency discriminators, among others. The microwave counters EIP 1230A and 1231A manufactured by EIP Microwave, Inc. and the Hewlett Packard electronic counter HP 5361B are examples of instruments currently in use to measure RF pulse frequencies. These methods, however, do not provide the required frequency measurement accuracy for state-of-the-art radar and ECM systems. Electronic counters can provide only 500 Khz accuracy for a 100 ns pulse width signal. The spectrum analyzer accuracy for a 100 ns pulse width is typically 150 Khz. Additionally, electronic counters and spectrum analyzers are expensive, bulky, and require specialized hardware. Synchronous detectors are limited to 10 Khz measurement accuracy for a 100 ns pulse width signal while digital frequency discriminators can provide only 100 Khz measurement accuracy for a 100 ns pulse width signal. However, as the radar and ECM systems become more advanced, test technology must improve in order to assure the proper system performance.

Furthermore, in order to characterize the performance of a Unit Under Test (UUT) in an end-to-end test environment, one should not have to access the internal structure of the UUT The present invention overcomes the aforementioned disadvantages.

SUMMARY OF THE INVENTION

The present invention is a real-time method that is able to measure the frequency of a RF pulse down to 100 nanoseconds in width with very high accuracy (less than 30 kilohertz) at RF signal frequencies up to 40 gigahertz.

According to the present invention, the foregoing and other objects are attained by using multi-purpose, commercial-off-the-shelf test devices, such as an RF signal down converter, a digitizer and a signal processor. The method for measuring the carrier frequency of a stream pulses comprises the steps of extracting pulse points and baseline data of a sample of the RF signal; determining the zero-crossings of the signal using signal interpolation of the pulse points and baseline data; calculating the period of the pulse stream signal from the determined zero-crossings; and calculating the frequency of the pulse stream signal from the calculated period.

In one embodiment the RF signal is mixed with a control frequency, filtered and then digitized. Preferably, data from two hundred pulses is collected in sequence, mixed and digitized to improve the the frequency calculation accuracy. A measurement algorithm is then applied to the digitized data which includes extracting pulse points and the baseline, removing DC component by subtracting the baseline from pulse points, zero interlacing the pulse points, applying a frequency analysis, filtering in a frequency domain and a second frequency analysis. Zero-crossings are then calculated using any of a number of interpolation techniques including linear interpolation, Sin(X)/X interpolation and polynomial interpolation. The period of the waveform is then calculated, from which the frequency is calculated.

In an alternate embodiment the method uses Sin(X)/X interpolation of the pulse points and baseline to determine zero-crossing points. An iterative search algorithm finds the zero-crossing points to an arbitrary accuracy of between about 1/100 to about 1/1,000,000. The period of the waveform is then calculated, from which the frequency is calculated.

An object of this invention is to improve the accuracy of RF pulse frequency measurements in real-time or near real-time, using only the RF output of the system under test as the input to the invention.

A further object of this invention is to provide an accurate RF pulse frequency measurement technique using low cost commercial-off-the-shelf (COTS) test equipment.

An advantage of this invention is that it samples only a small number of RF pulses thereby reducing measurement time.

Another advantage of this invention is that it is able to characterize some frequency agile pulsed signals in which the carrier frequency varies over time.

A further advantage of this invention is that it is easy to maintain and to operate.

Additional objects, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

BRIEF DESCRIPTION OF THE DRAWINGS

The above and other objects and advantages of this invention will be apparent on consideration of the following detailed description, taken in conjunction with the accompanying drawings, in which like reference characters refer to like parts throughout, and in which.

DETAILED DESCRIPTION OF THE PREFERRED EMBODIMENTS OF THE INVENTION

The following detailed description, which describes only the preferred embodiments of the invention in detail, is understood only to be an illustration of the best mode contemplated of carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

Figure 1:
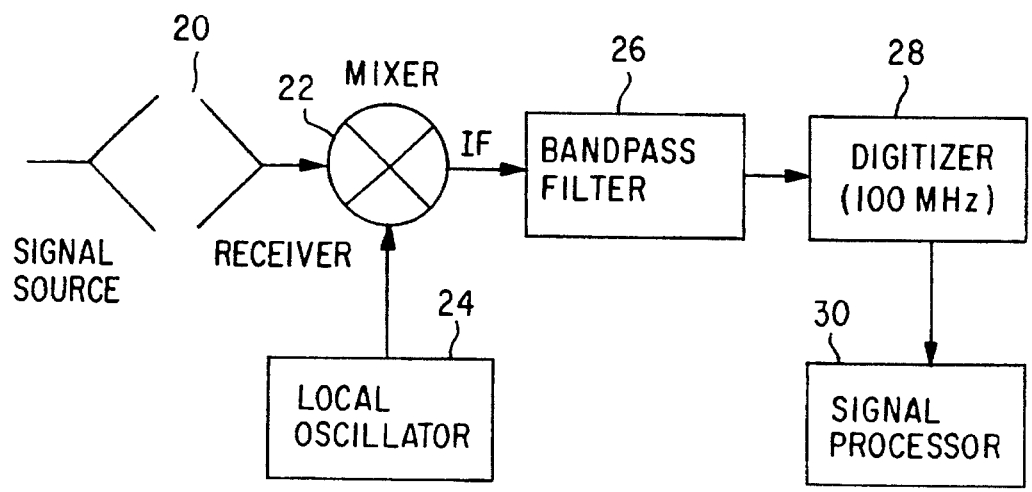
FIG. 1 is a block diagram of the RF pulse signal acquisition procedure.
Figure 2:
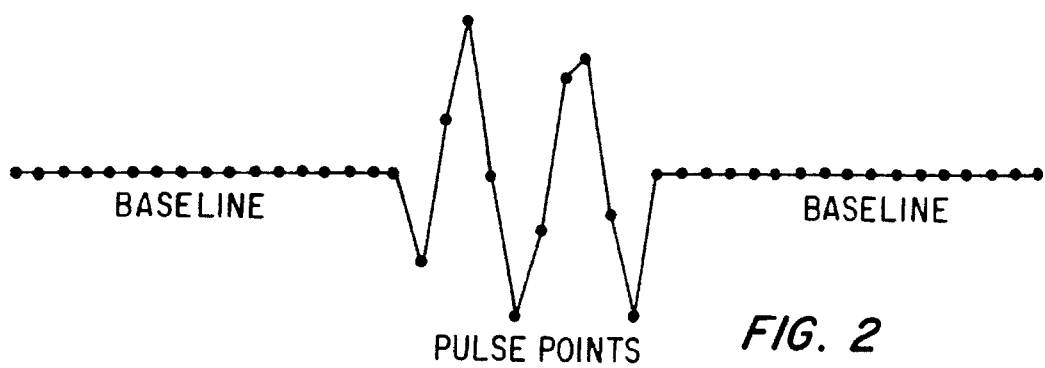
FIG. 2 is a depiction of a digitized sinusoidal signal.

FIG. 1 illustrates the signal acquisition mechanism of the present invention. The input pulses generated by the UUT are frequency down converted to a pulse stream having an intermediate frequency (IF). Mixer 22 receives the test signal from source 20 and a control frequency generated by a local oscillator 24 and outputs an IF signal as the difference between their frequencies (e.g. Frequency$_{RF}$ −Frequency$_{control}$=IF). The IF signal passes through bandpass filter 26 to remove unwanted high frequency components. The IF signal is sampled by a digitizer 28 and transferred to a signal processor 30 to perform frequency analysis. The preferred IF is approximately from 20 to 30% of the digitizer sampling frequency. Preferably, the sampling frequency of the digitizer chosen should allow for at least two cycles of the down converted test signal (i.e. the IF signal) to be present within each acquired pulse of the test signal. For example, given a 100 nanosecond pulse, digitized at 100 megahertz, preferably, the IF frequency should be approximately 25 megahertz. Such a configuration would result in 2.5 cycles of the IF signal being digitized as shown in FIG. 2. In order to improve frequency estimation accuracy, data from two hundred pulses are collected in sequence.

Figure 3:
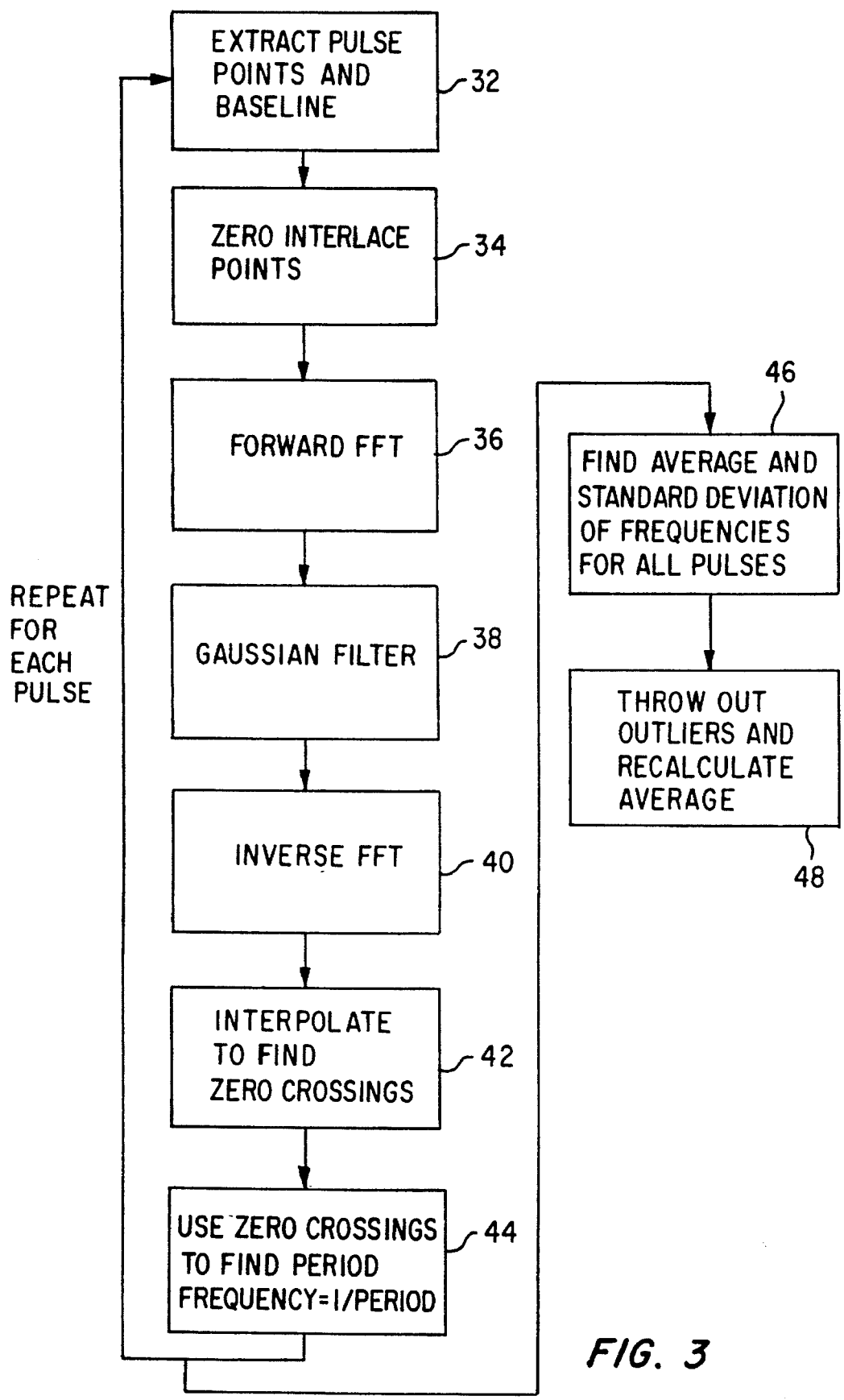
FIG. 3 is a flow diagram of one embodiment of the invention.

The acquired data of FIG. 2 serves as the input to the pulse frequency measurement algorithm, shown in FIG. 3. The method interpolates the signal by first extracting pulse points and the baseline data 32. Pulse points refer to points within the RF pulse, and baseline points surround the pulse points where the RF signal is not present. The baseline is extracted and subtracted from the pulse points in order to remove any DC component from the pulse sine wave, thereby improving accuracy of the zero-crossings. The method then provides for zero interlacing the pulse points 34 of the input signal by adding zeros between the extracted points. A preferred range of an interlacing ratio is between 2 and 10. The most preferred interlacing ration is 4. Additional functions include applying a forward Fast Fourier Transform (FFT) frequency analysis 36, filtering in a frequency domain using a Gaussian filter 38, and then applying an inverse FFT on the filtered frequency domain data 40.

The resultant data is then used to determine zero-crossings via signal interpolation 42. This method provides high quality image signal suppression as well as smooth transient response. Possible interpolation techniques include linear interpolation, Sin(X)/X interpolation, and polynomial interpolation. The zero-crossing times 44 are used to determine the period of the waveform, which together with the digitizer sample rate can be used to calculate the IF. The technique is applied repeatedly to all RF pulses. The final IF frequency measurement is the average of all the measured results 46, after rejection of outliers (preferably between 1 and 2 standard deviations) 48. The actual RF frequency is the sum of the measured IF frequency and the control frequency of the local oscillator 24.

Figure 4:
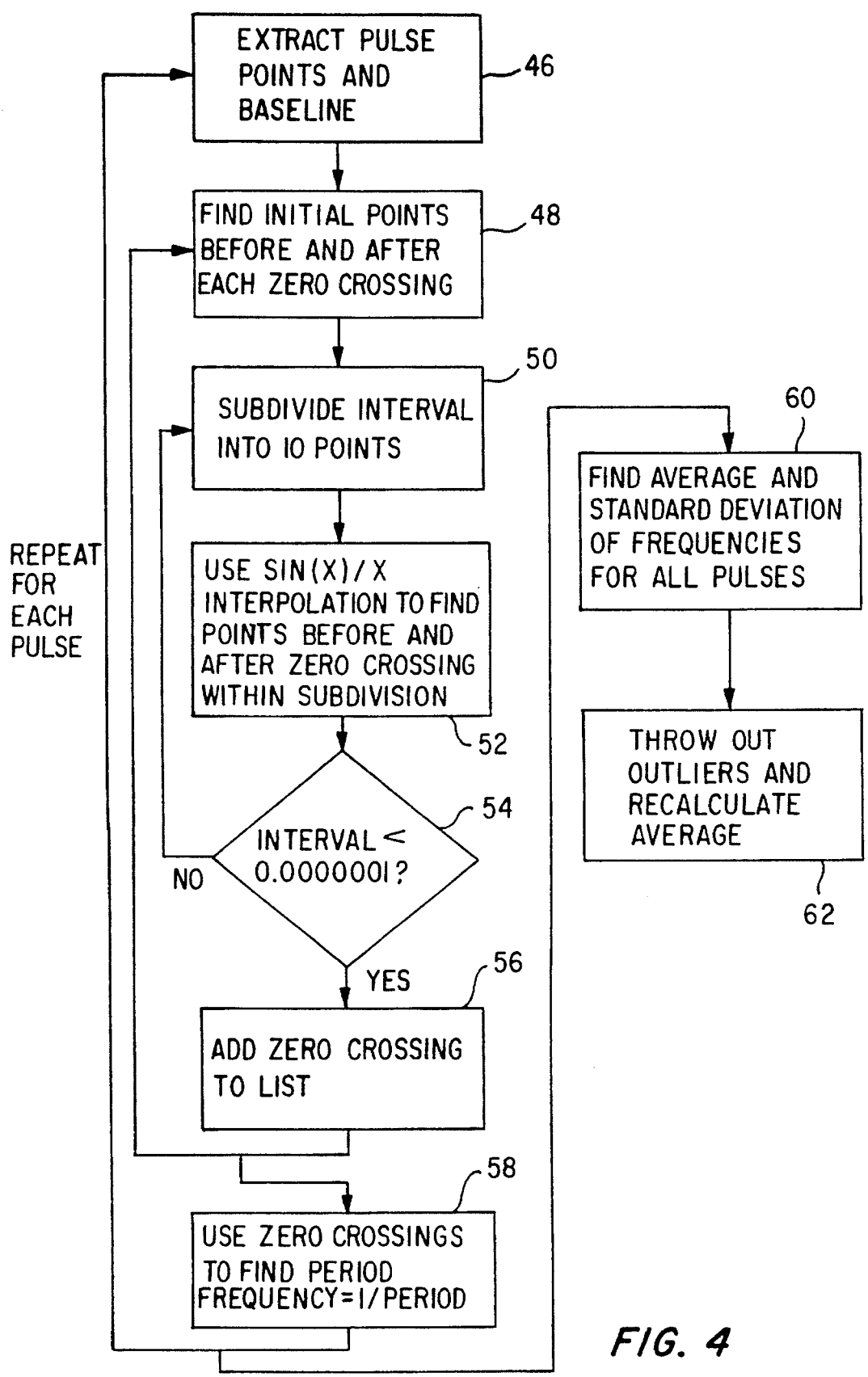
FIG. 4 is a flow diagram of an alternate embodiment of the invention.

FIG. 4 illustrates an alternate embodiment of the invention using direct Sin(X)/X interpolation of the acquired data to determine zero-crossing points. The acquired data of FIG. 2 serves as the input to the pulse frequency measurement algorithm. The method interpolates the signal by first extracting pulse points and the baseline 46. The baseline is extracted and subtracted from the pulse points in order to remove any DC component from the pulse sine wave, thereby improving accuracy of the zero-crossings. The method then locates initial points before and after each zero crossing 48 within a time interval. The time interval is then subdivided into ten points 50 and interpolated using Sin(X)/X to find points before and after a zero crossing within a subdivision 52. An iterative search algorithm finds the zero-crossing point to an arbitrary accuracy of between $1/100$ to about $1/1,000,000$ of the sample interval of the digitizer 54. It is understood that any interval can be used, however, the smaller the interval, the greater the accuracy. Once a point is determined to be within the interval, the point is added to a list 56 of zero crossings. The technique is applied repeatedly to all RF pulses. The zero-crossing times are used to determine the period of the waveform, which together with the sample rate can be used to calculate the IF 58. The final IF frequency measurement is the average of all the measured results 60, after rejection of outliers (preferably between 1 and 2 standard deviations) 62. The actual RF frequency is the sum of the measured IF frequency and the local oscillator 24 control frequency of the down converter.

The practical importance of the invention will be realized when it is understood that the method described can significantly improve the accuracy of measuring the frequency of narrow pulse widths in a cost efficient manner, in real time and in a noisy environment.

It will be understood that the particular embodiments described above are only illustrative of the principles of the present invention, and that various modifications could be made by those skilled in the art without departing from the scope and spirit of the present invention, which is limited only by the claims that follow.

What is claimed is:

1. A method for measuring the carrier frequency of a stream of RF pulses comprising:

(a) down converting said RF pulses to a pulse stream having an intermediate carrier frequency by taking the difference between the carrier frequency of said RF pulses and the carrier frequency of a control frequency;

(b) digitizing said pulse stream;

(c) extracting pulse points and baseline data of a sample from said pulse stream;

(d) subtracting said baseline data from said pulse points;

(e) locating initial points in time before and after each zero crossing within a time interval, subdividing said time interval and repetitively interpolating said initial points using Sin(X)/X to find time points before and after a zero crossing within a specified time accuracy range;

(f) calculating the period of the carrier frequency of said pulse stream signal from said determined zero-crossing times;

(g) calculating the carrier frequency of said pulse stream signal from said calculated period; and (h) calculating the RF pulse stream carrier frequency by summing said calculated intermediate carrier frequency with said control carrier frequency.

2. The method of claim 1 further comprising repeating steps (a) through (h) on other pulse streams collected in sequence and averaging the frequency values obtained in step (h) for all of the pulse streams.

* * * * *